United States Patent
Motoyama et al.

(10) Patent No.: US 9,487,859 B2
(45) Date of Patent: Nov. 8, 2016

(54) OPERATING METHOD OF VERTICAL HEAT TREATMENT APPARATUS, STORAGE MEDIUM, AND VERTICAL HEAT TREATMENT APPARATUS

(71) Applicant: TOKYO ELECTRON LIMITED, Tokyo (JP)

(72) Inventors: Yutaka Motoyama, Oshu (JP); Kohei Fukushima, Oshu (JP); Keisuke Suzuki, Nirasaki (JP); Hiromi Takahashi, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/664,986

(22) Filed: Mar. 23, 2015

(65) Prior Publication Data
US 2015/0267293 A1 Sep. 24, 2015

(30) Foreign Application Priority Data

Mar. 24, 2014 (JP) .................................. 2014-060494
Jan. 26, 2015 (JP) .................................. 2015-012539

(51) Int. Cl.
C23C 16/44 (2006.01)
C23C 16/46 (2006.01)
C23C 16/455 (2006.01)

(52) U.S. Cl.
CPC ....... *C23C 16/4411* (2013.01); *C23C 16/4401* (2013.01); *C23C 16/45546* (2013.01); *C23C 16/46* (2013.01)

(58) Field of Classification Search
None
See application file for complete search history.

(56) References Cited

U.S. PATENT DOCUMENTS

2009/0258504 A1* 10/2009 Nakaiso ................ C23C 16/345
438/758

FOREIGN PATENT DOCUMENTS

| JP | 5-144736 | A | 6/1993 |
|----|----------|---|--------|
| JP | 8-45859 | A | 2/1996 |
| JP | 2003-100731 | A | 4/2003 |
| JP | 2007-201422 | A | 8/2007 |
| JP | 2009-044191 | A | 2/2009 |
| JP | 2009-182006 | A | 8/2009 |
| JP | 4844261 | B2 | 10/2011 |
| WO | 2005/050725 | A1 | 6/2005 |

* cited by examiner

Primary Examiner — Joseph Miller, Jr.
(74) Attorney, Agent, or Firm — Nath, Goldberg & Meyer; Jerald L. Meyer

(57) ABSTRACT

An operating method of a vertical heat treatment apparatus which performs a film forming process by keeping the interior of a vertical reaction tube surrounded by a heating mechanism at a vacuum atmosphere and by supplying film forming gases to substrates accommodated within the reaction tube, includes: performing a film forming process with respect to the substrates by carrying a substrate holder holding a plurality of substrates in a shelf form into the reaction tube; carrying out the substrate holder from the reaction tube; and carrying a cooling jig into the reaction tube to cool an inner wall of the reaction tube so as to peel a thin film adhering to the inner wall of the reaction tube by a thermal stress and so as to collect the thin film in the cooling jig by thermophoresis.

9 Claims, 15 Drawing Sheets

OPERATING METHOD OF VERTICAL HEAT TREATMENT APPARATUS, STORAGE MEDIUM, AND VERTICAL HEAT TREATMENT APPARATUS

CROSS-REFERENCE TO RELATED APPLICATIONS

This application claims the benefit of Japanese Patent Application No. 2014-060494, filed on Mar. 24, 2014 and Japanese Patent Application No. 2015-012539, filed on Jan. 26, 2015, in the Japan Patent Office, the disclosure of which is incorporated herein in their entirety by reference.

TECHNICAL FIELD

The present disclosure relates to an operating method of a vertical heat treatment apparatus which performs a film forming process collectively on a plurality of substrates within a vertical reaction tube, a non-transitory computer-readable storage medium which stores the operating method, and a vertical heat treatment apparatus.

BACKGROUND

As one example of an apparatus for forming thin films (e.g., silicon nitride (SiN) films) on substrates such as semiconductor wafers (hereinafter referred to as "wafers") or the like, there is known a batch-type vertical heat treatment apparatus which performs a film forming process collectively on a plurality of wafers within a vertical quartz-made reaction tube. As a specific film forming method using this apparatus, there is employed, e.g., a so-called ALD (Atomic Layer Deposition) method in which a silicon-containing source gas and a reaction gas (e.g., an ammonia ($NH_3$) gas) for nitriding the source gas are alternately supplied plural times. Silicon nitride films are formed not only on surfaces of the wafers but also on outer surfaces of gas injectors for supplying the respective gases, an inner wall surface of the reaction tube, or the like.

However, the silicon nitride films formed on the gas injectors or the reaction tube are very large in internal stress of the film and are greatly different in a thermal expansion rate and a thermal contraction rate from quartz of which the reaction tube is made. Thus, along with heating and cooling of the reaction tube, the silicon nitride films are easily separated from the surface of the gas injectors or the reaction tube. For that reason, if a process for forming the silicon nitride films is repeated, the silicon nitride films separated from the surface of the gas injectors or the reaction tube become particles and adhere to the wafers. This leads to a reduction of throughput.

There is known a technique in which adhesion of particles to wafers is prevented by heating and cooling a reaction container after silicon nitride films are formed. In this technique, however, an electric current larger than an electric current used during an ordinary process is supplied to a heater for heating the interior of the reaction container. Therefore, the heater is easily deteriorated (the lifespan of the heater is shortened). Further, in this case, when cooling the reaction container, a cooling gas having an extremely low temperature of 0 degrees C. or so is blown from the outside of the reaction container. For that reason, when restoring an internal temperature of the reaction container to a temperature for a process to be subsequently performed, the internal temperature of the reaction container is difficult to be stabilized.

There are known a technique of using two boats, a technique of evacuating the interior of a reaction chamber when unloading a boat, and a technique of discharging particles by supplying a purge gas into a reaction chamber at a large flow rate when loading or unloading wafers. In these cases, however, it cannot be said that the techniques are capable of sufficiently suppressing adhesion of particles to wafers.

SUMMARY

Some embodiments of the present disclosure provide a technique capable of suppressing adhesion of particles to substrates when the substrates are collectively subjected to a film forming process within a vertical reaction tube.

According to one embodiment of the present disclosure, an operating method of a vertical heat treatment apparatus which performs a film forming process by keeping the interior of a vertical reaction tube surrounded by a heating mechanism at a vacuum atmosphere and by supplying film forming gases to substrates accommodated within the reaction tube, includes: performing a film forming process with respect to the substrates by carrying a substrate holder holding a plurality of substrates in a shelf form into the reaction tube; carrying out the substrate holder from the reaction tube; and carrying a cooling jig into the reaction tube to cool an inner wall of the reaction tube so as to peel a thin film adhering to the inner wall of the reaction tube by a thermal stress and so as to collect the thin film in the cooling jig by thermophoresis.

According to another embodiment of the present disclosure, a non-transitory computer readable storage medium which stores a computer program operating on a computer. The computer program includes steps organized so as to execute the aforementioned operating method of a vertical heat treatment apparatus.

According to still another embodiment of the present disclosure, a vertical heat treatment apparatus which performs a film forming process by carrying a substrate holder holding a plurality of substrates in a shelf form into a vertical reaction tube surrounded by a heating mechanism and by supplying film forming gases to the substrates, includes: a cooling jig configured to cool an inner wall of the reaction tube so as to peel a thin film adhering to the inner wall of the reaction tube by a thermal stress and so as to collect the thin film by thermophoresis; and a lift mechanism configured to carry the substrate holder and the cooling jig into and out of the reaction tube.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
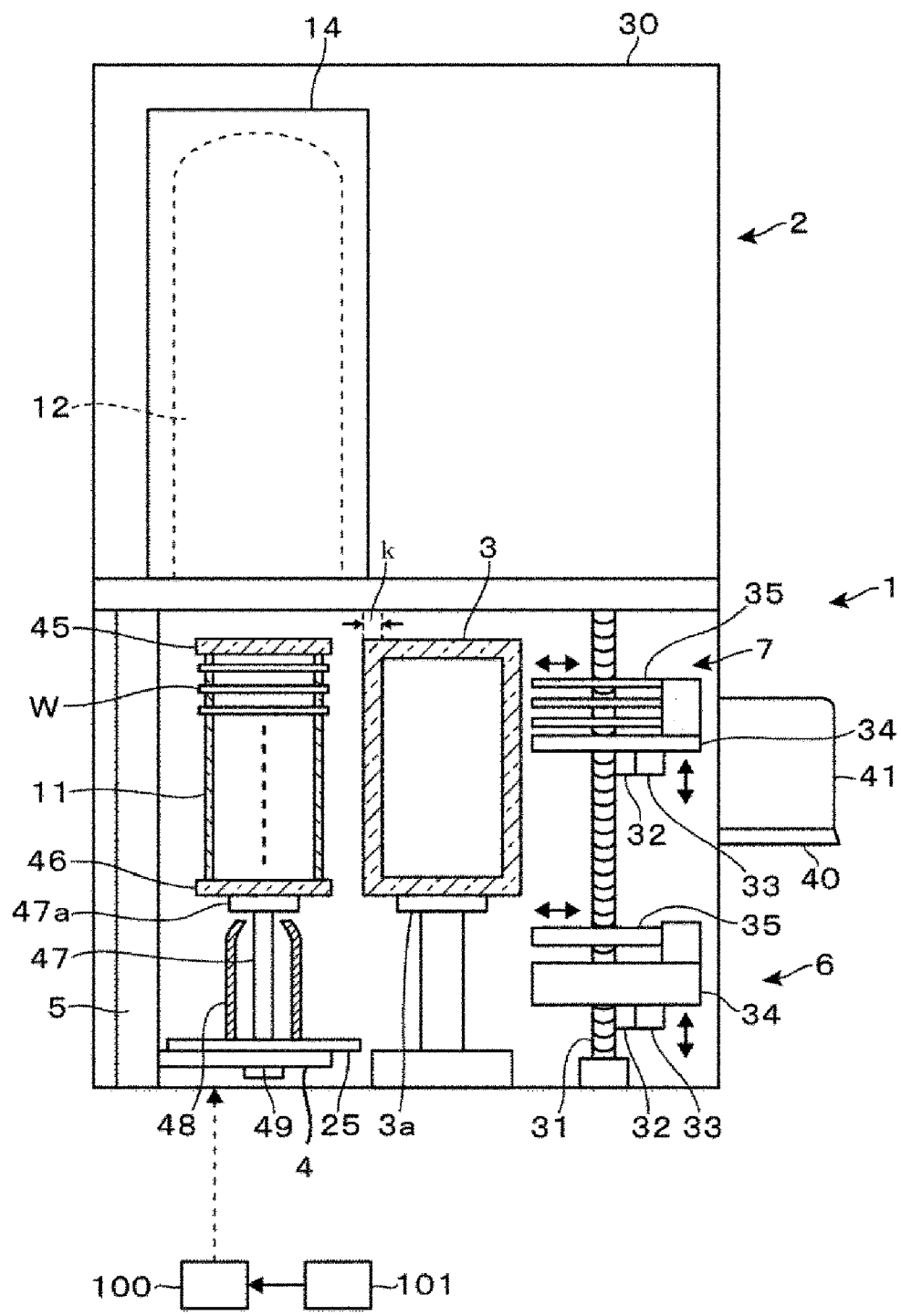
FIG. 1 is a vertical sectional view showing one example of a vertical heat treatment apparatus according to the present disclosure.
Figure 2:
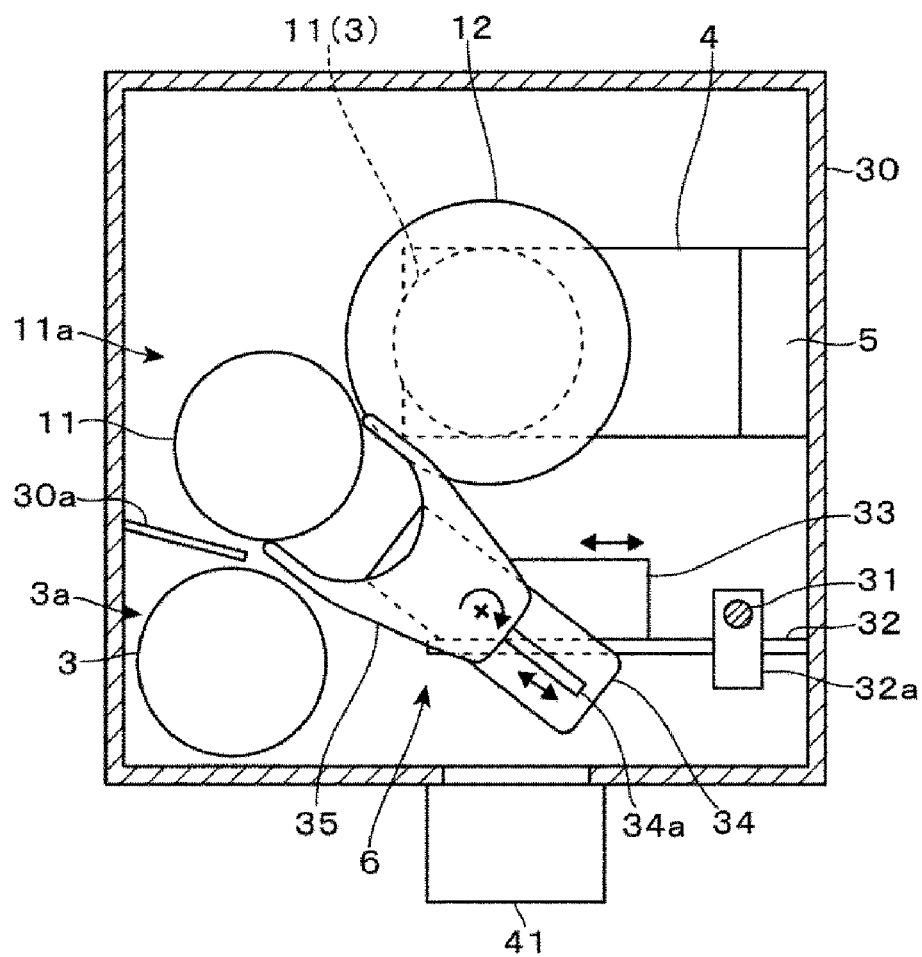
FIG. 2 is a horizontal sectional view showing the vertical heat treatment apparatus shown in FIG. 1.

One example of a vertical heat treatment apparatus according to an embodiment of the present disclosure will now be described with reference to FIGS. 1 to 6. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments. As shown in FIG. 1, the apparatus is configured to mount a plurality of wafers W on a wafer boat 11 as a substrate holder positioned in a substrate transfer region 1, carry the wafer boat 11 into a vertical reaction tube 12 installed in a processing region 2 existing above the substrate transfer region 1, and then perform a film forming process of thin films with respect to the respective wafers W. In order to prevent the thin film adhering to (formed on) an inner wall surface of the reaction tube 12 from being generated as particles 10 and scattering toward the wafers W as will be described later, a cooling jig (collecting jig) 3 for collecting the particles 10 is installed at a position laterally spaced apart from the wafer boat 11 in the substrate transfer region 1. In FIGS. 1 and 2, reference numeral 30 designates a housing which constitutes an exterior body of the vertical heat treatment apparatus. Reference numeral 40 designates a mounting stand disposed outside the housing 30 such that a transportation container (FOUP) 41 accommodating a plurality of wafers W is placed on the mounting stand 40.

Prior to describing an internal structure of the reaction tube 12 and a specific configuration of the cooling jig 3, details of individual members disposed in the substrate transfer region 1 will be first described. As shown in FIGS. 1 and 2, a boat elevator 4, which is moved up and down by a lift mechanism 5, is installed below the reaction tube 12 in the substrate transfer region 1. A rotation shaft 47, which is rotated about a vertical axis by a rotating mechanism 49, is installed in the boat elevator 4. In a top portion of the rotation shaft 47, there is installed a rotary table 47a on which the wafer boat 11 or the cooling jig 3 is placed. The boat elevator 4 is provided with a lid 25 for closing a lower end opening of the reaction tube 12 to be described later. A heat insulating portion 48 is installed in the lid 25 so as to surround, e.g., the rotation shaft 47.

As shown in FIG. 2, at a position laterally spaced apart from the boat elevator 4, standby regions (standby positions) 11a and 3a, which are formed of mounting portions for temporarily supporting the wafer boat 11 and the cooling jig 3, are formed side by side in a horizontal direction. In this example, the standby region 11a for the wafer boat 11 is formed adjacent to the boat elevator 4. The standby region 3a for the cooling jig 3 is formed at an opposite side of the boat elevator 4 when seen from the standby region 11a. As shown in FIG. 2, the boat elevator 4, the standby region 11a and the standby region 3a are arranged side by side so as to make an arc shape when seen in a plan view. In FIG. 2, reference numeral 30a designates a shielding plate installed between the standby regions 11a and 3a. A unit (not shown) provided with a filter and a fan for supplying a clean air to the standby regions 11a and 3a is disposed at the opposite side of the boat elevator 4 when seen from the standby regions 11a and 3a. The unit is not described here.

As shown in FIG. 2, if an imaginary circle which interconnects the boat elevator 4, the standby region 11a and the standby region 3a when seen in a plan view is drawn, a first transfer mechanism 6 for delivering the wafer boat 11 or the cooling jig 3 to and from the rotary table 47a on the boat elevator 4 and the standby regions 11a and 3a is installed substantially at the center position of the imaginary circle. The first transfer mechanism 6 is configured to move up and down and move toward or away from the boat elevator 4 and the standby regions 11a and 3a.

That is to say, at a position spaced apart from the first transfer mechanism 6 toward an inner wall surface of the housing 30, a lift shaft 31 extending up and down along the longitudinal direction of the wafer boat 11 is installed as shown in FIGS. 1 and 2. One end of a substantially plate-shaped base portion 32 extending from the lift shaft 31 toward an internal region of the housing 30 is vertically movably installed in the lift shaft 31. That is to say, a lift member 32a configured to vertically move along the lift shaft 31 and provided with a drive unit such as a motor or the like is installed on the lift shaft 31. One end of the base portion 32 is connected to the lift member 32a.

A substantially box-shaped advancing/retreating portion 33, which moves forward and backward along a rail (not shown) configured to extend in the longitudinal direction of the base portion 32, is installed at the other end of the base portion 32. A plate-shaped rotary plate 34, which rotates about a vertical axis with respect to the advancing/retreating portion 33, is stacked on an upper surface of the advancing/retreating portion 33. A rail 34a extending along a horizontal direction is formed in the rotary plate 34. An arm 35 capable of advancing and retreating along the rail 34a is installed on the upper surface of the rotary plate 34. For example, the rotary table 47a installed on the boat elevator 4 is formed into a circular shape having a diameter smaller than a diameter of a lower surface of the wafer boat 11 or the cooling jig 3. Therefore, bifurcated tip portions of the arm 35 can be moved to below the wafer boat 11 or the cooling jig 3. Then, the wafer boat 11 or the cooling jig 3 is supported in a transferrable manner by moving the arm 35 upward. When the wafer boat 11 or the cooling jig 3 is mounted on the rotary table 47a and in the standby region 11a or 3a, the arm 35 supporting the wafer boat 11 or the cooling jig 3 is moved down. Subsequently, the arm 35 is retreated.

A second transfer mechanism 7 for delivering the wafers W between the transportation container 41 and the wafer boat 11 is installed above the first transfer mechanism 6 described above. The second transfer mechanism 7 has substantially the same configuration as the aforementioned first transfer mechanism 6. Specifically, the second transfer mechanism 7 includes a base portion 32, an advancing/retreating portion 33, a rotary plate 34 and a plurality of arms 35. The second transfer mechanism 7 is configured to move vertically along the lift shaft 31 just like the first transfer mechanism 6. The second transfer mechanism 7 is provided with five arms 35 in order to collectively transfer a plurality of, e.g., five, wafers W. In FIG. 1, for the sake of simplified illustration, the number of the arms 35 of the second transfer mechanism 7 is schematically shown. Since arrangement positions of the first transfer mechanism 6 and the second transfer mechanism 7 vertically overlap with each other, the second transfer mechanism 7 is not shown in FIG. 2.

Next, the wafer boat 11, the cooling jig 3 and internal members of the reaction tube 12 will be described in detail. The wafer boat 11 is made of quartz. As shown in FIG. 1, the wafer boat 11 is configured to mount a plurality of, e.g., 150, wafers W in a shelf form. At upper and lower sides of wafer mounting region of the wafer boat 11, a top plate 45 and a bottom plate 46 are formed as parts of the wafer boat 11. The aforementioned first transfer mechanism 6 is configured to transfer the wafer boat 11 by supporting the bottom plate 46 from below. When the wafer boat 11 is air-tightly carried into the reaction tube 12, a height position of the lowermost wafer W among the plurality of wafers W (product wafers) mounted on the wafer boat 11 is higher than a position of a lower end portion of the reaction tube 12 by 30% of the height dimension of the reaction tube 12.

As shown in FIG. 1, in this example, the cooling jig 3 is formed into a hollow cylindrical body by quartz. A thickness k of the cylindrical body is set at, e.g., from 5 mm to 50 mm, such that the cooling jig 3 becomes larger in heat capacity than the wafer boat 11 which mounts the wafers W. When seen in a plan view, a diameter of the cylindrical body is set larger than a diameter of the wafers W or a diameter of the wafer boat 11 such that an outer surface of the cooling jig 3 and an inner surface of the reaction tube 12 are positioned as close as possible when the cooling jig 3 is carried into the reaction tube 12. Specifically, the diameter of the cylindrical body is set at from 320 mm to 360 mm.

Figure 3:
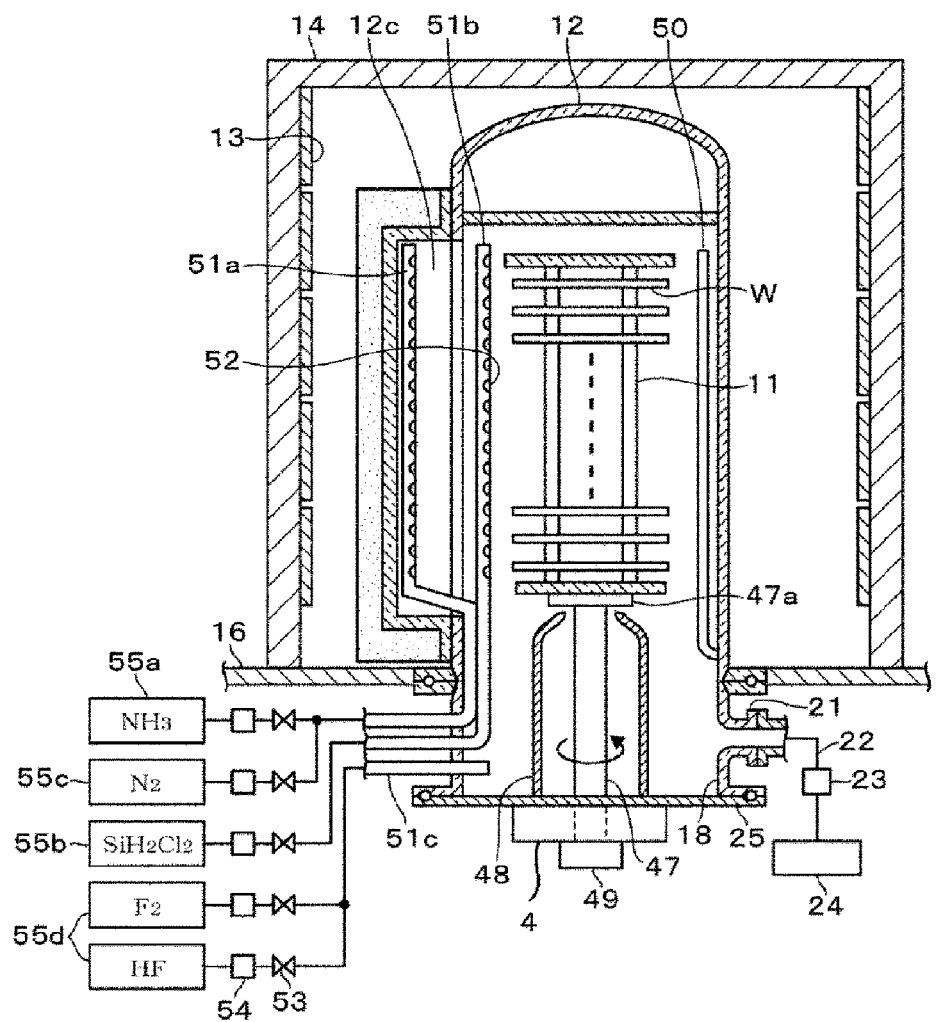
FIG. 3 is a vertical sectional view showing one example of the vertical heat treatment apparatus.
Figure 4:
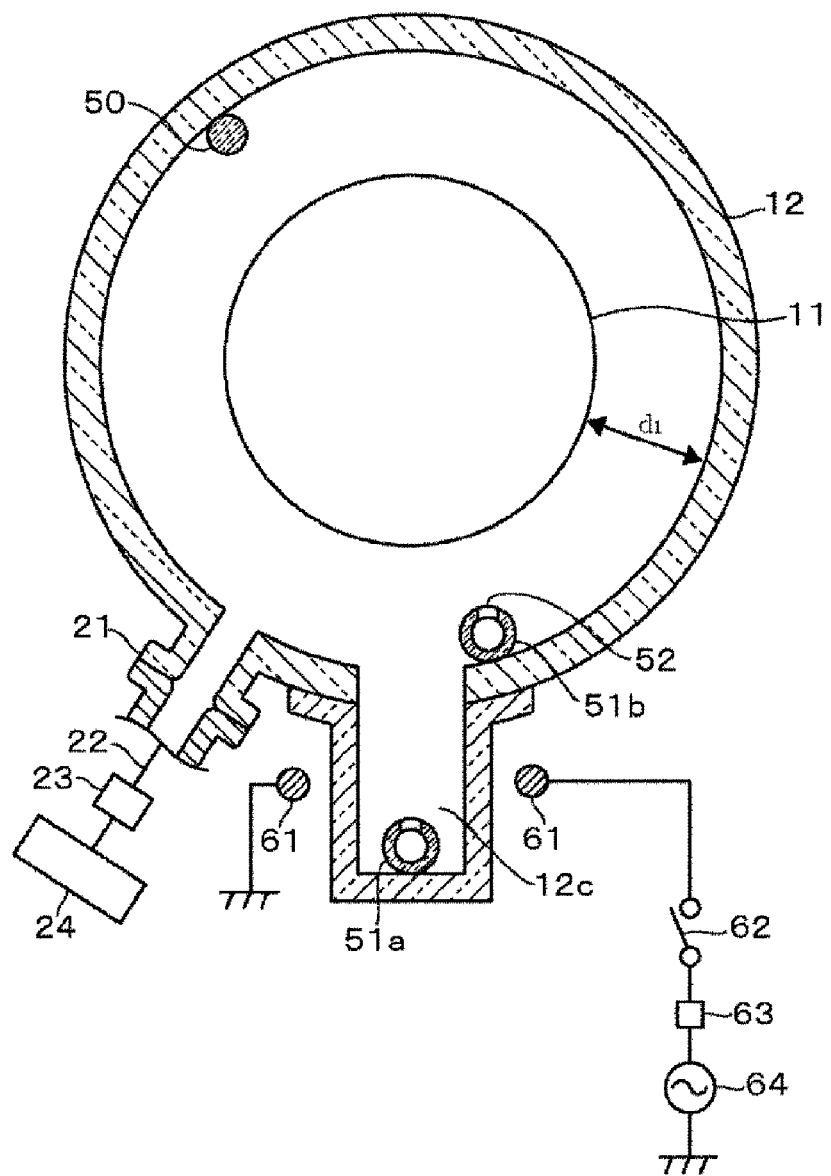
FIG. 4 is a horizontal sectional view showing the vertical heat treatment apparatus shown in FIG. 3.
Figure 5:
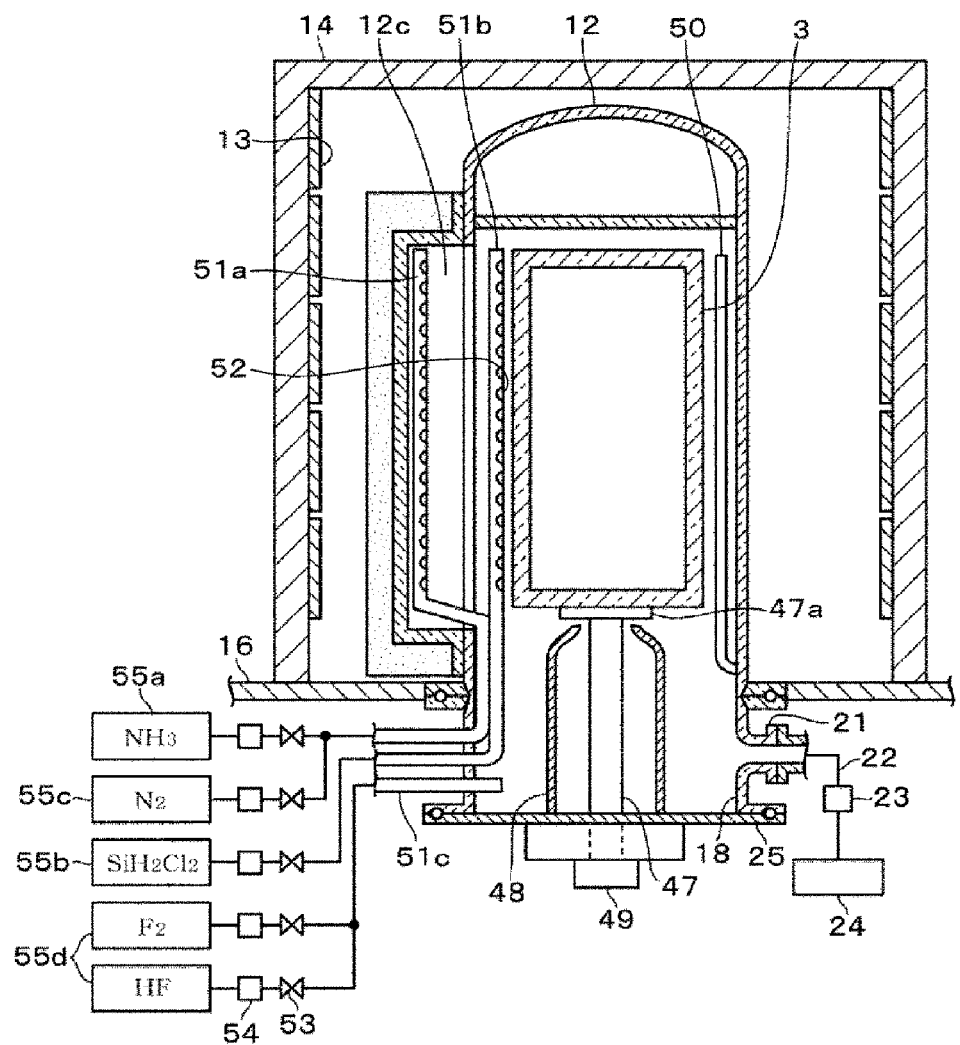
FIG. 5 is a vertical sectional view showing another example of the vertical heat treatment apparatus.
Figure 6:
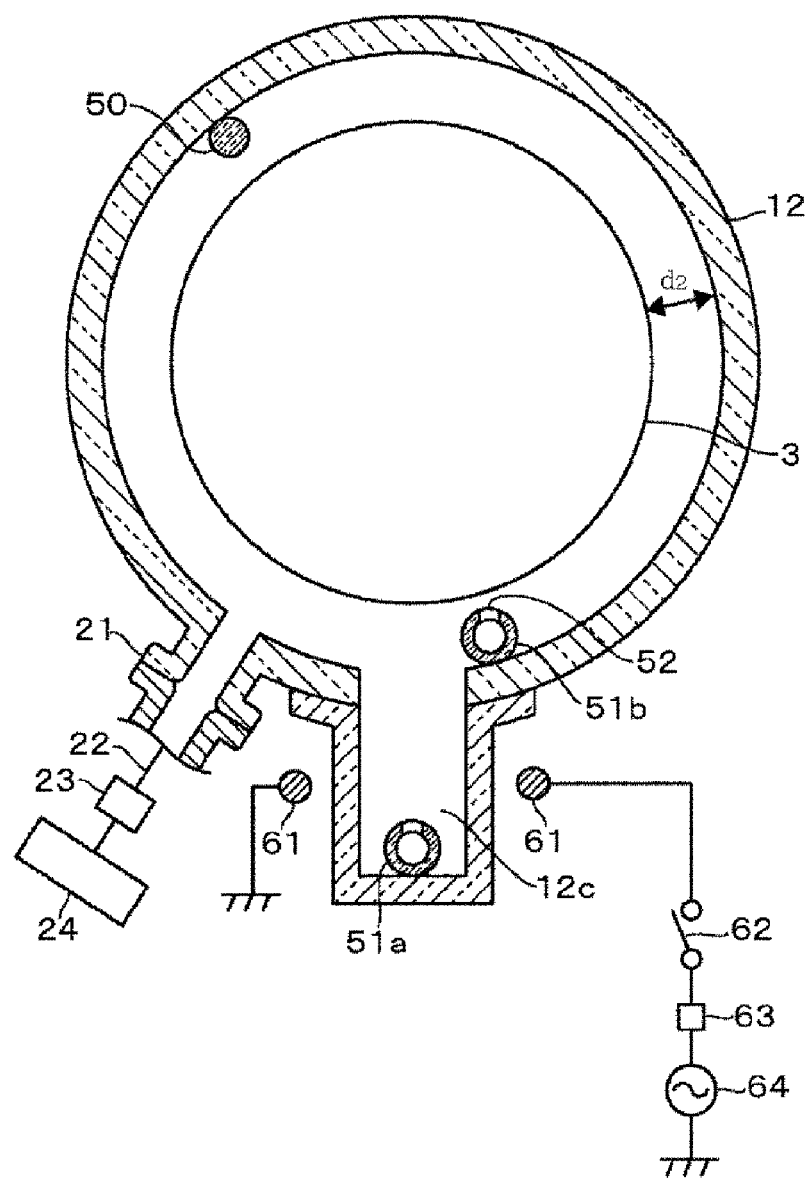
FIG. 6 is a horizontal sectional view showing the vertical heat treatment apparatus shown in FIG. 5.

Next, the internal structure of the reaction tube 12 will be described. The reaction tube 12 is made of quartz. As shown in FIG. 3, the reaction tube 12 is formed into a substantially cylindrical shape with a lower surface of the reaction tube 12 opened. Thus, the wafer boat 11 or the cooling jig 3 is air-tightly carried into the reaction tube 12 from below. FIGS. 3 and 4 show a state in which the wafer boat 11 is disposed within the reaction tube 12. A spaced-apart distance $d_1$ between the reaction tube 12 and the wafer boat 11 is set at from 10 mm to 35 mm over a length of the reaction tube 12. On the other hand, FIGS. 5 and 6 show a state in which, instead of the wafer boat 11, the cooling jig 3 is disposed within the reaction tube 12. A spaced-apart distance $d_2$ between the reaction tube 12 and the cooling jig 3 is set at from 5 mm to 30 mm over the length of the reaction tube 12. Thus, in this example, the spaced-apart distance $d_2$ is set smaller than the spaced-apart distance $d_1$ over the length of the reaction tube 12. In some embodiments, the relationship between the spaced-apart distances $d_2$ and $d_1$ may be set such that the spaced-apart distance $d_2$ becomes smaller than the spaced-apart distance $d_1$ over 70% or more of the length of the reaction tube 12.

As shown in FIGS. 3 and 5, a cylindrical heating furnace body 14 is installed outside the reaction tube 12 so as to surround the reaction tube 12. Heaters 13 as heating mechanisms are disposed on an inner wall surface of the heating furnace body 14 in a circumferential direction. In FIGS. 3 and 5, reference numeral 16 designates a base plate and reference numeral 18 designates a manifold which supports the reaction tube 12 from below.

As shown in FIGS. 4 and 6, when seen in a plan view, one end portion (front portion) of the reaction tube 12 is expanded outward over the length of the reaction tube 12, thereby forming a plasma generating region 12c. An ammonia gas nozzle 51a as a process gas supply unit (gas injector) extending along the longitudinal direction of the wafer boat 11 is accommodated in the plasma generating region 12c. A lower end portion of the ammonia gas nozzle 51a is air-tightly penetrated through the inner wall surface of the reaction tube 12 defining the plasma generating region 12c and is connected to an ammonia gas supply source 55a. As shown in FIGS. 3 and 5, an end portion of the ammonia gas nozzle 51a existing at the side of the ammonia gas supply source 55a is branched in a midway section of the ammonia gas nozzle 51a and is connected to a supply source 55c of a purge gas such as a nitrogen ($N_2$) gas or the like.

As shown in FIGS. 4 and 6, in order to change an ammonia gas supplied from the ammonia gas nozzle 51a to plasma, a pair of plasma generating electrodes 61 and 61 is installed outside the plasma generating region 12c (outside the reaction tube 12) so as to interpose the plasma generating region 12c between the plasma generating electrodes 61 and 61 in the left-right direction. Each of the plasma generating electrodes 61 and 61 is formed to extend over the length of the wafer boat 11 and is disposed at a position adjoining the plasma generating region 12c. A high-frequency power supply source 64 having a frequency of, e.g., 13.56 MHz, and an output of, e.g., 1 kW, is connected to the plasma generating electrodes 61 and 61 through a switch unit 62 and a matcher 63.

As shown in FIGS. 4 and 6, a source gas nozzle 51b for supplying a silicon-containing source gas, e.g., a DCS (dichlorosilane) gas in this example, is disposed at the right side when seen from the plasma generating region 12c existing at a position adjoining the wafer boat 11. A lower end portion of the source gas nozzle 51b is air-tightly penetrated through the inner wall surface of the reaction tube 12 and is connected to a source gas supply source 55b. In FIG. 3 and other figures, reference numeral 52 designates gas ejection holes which are formed in a corresponding relationship with mounting positions of the respective wafers W.

As shown in FIGS. 3 and 5, a cleaning gas nozzle 51c extending from a supply source 55d of a cleaning gas such as a hydrogen fluoride (HF) gas, a fluorine ($F_2$) gas or the like is air-tightly penetrated through the inner wall surface of the reaction tube 12 at a position near penetration positions of the gas nozzles 51a and 51b. A tip portion of the cleaning gas nozzle 51c is opened at a position below the wafer boat 11. In FIGS. 3 and 5, reference numeral 53 designates a valve and reference numeral 54 designates a flow rate control unit. In FIGS. 4 and 6, the cleaning gas nozzle 51c is not shown.

A vertically extending rod 50 is disposed within the reaction tube 12 so as to be located opposite the respective gas nozzles 51a, 51b and 51c. Temperature detecting units (end portions of thermocouples) (not shown) for measuring an internal temperature of the reaction tube 12 are installed on the side surface of the rod 50. The temperature detecting units are disposed at a plurality of points along the longitudinal direction of the rod 50.

As shown in FIGS. 4 and 6, an exhaust port 21 provided with a tip portion extending in a flange shape and made of quartz is formed in the reaction tube 12 at a position laterally spaced apart from the plasma generating region 12c. A vacuum pump 24 as a vacuum exhaust mechanism is connected through a pressure regulating unit 23, such as a butterfly valve or the like, to an exhaust line 22 extending from the exhaust port 21. In FIGS. 3 and 5, for the sake of convenience in illustration, the exhaust port 21 is shown at a position opposing the plasma generating region 12c.

As shown in FIG. 1, a control unit 100 composed of a computer for controlling the overall operation of the apparatus is installed in the vertical heat treatment apparatus. A program for performing a film forming process to be described later is stored in a memory of the control unit 100. The program is installed into the control unit 100 from a storage unit 101 which is a storage medium such as a hard disk, a compact disk, a magneto-optical disk, a memory card, a flexible disk or the like.

Next, a description will be made on an operation of the aforementioned embodiment, namely an operating method of the vertical heat treatment apparatus. First, the outline of the operating method will be described. In the vertical heat treatment apparatus, as shown at an upper stage in FIG. 7, when a batch process (film forming process of thin film) for a plurality of wafers W is repeated plural times, deposits 200 which cause the generation of particles 10 are removed from an inner wall of the reaction tube 12 between one batch process and another batch process subsequent to the one batch process.

Subsequently, a description will be made on a specific process performed by the vertical heat treatment apparatus. First, it is assumed that the wafer boat 11 mounting a plurality of wafers W has already been air-tightly carried into the reaction tube 12 and further that a film forming process of a thin film (silicon nitride film) for the respective wafers W has already been started. Assuming that a start time of the film forming process is "t0", a temperature of the respective heaters 13 described above is set at a predetermined temperature $T_0$ (550 degrees C.), namely a film forming temperature, at time t0. Accordingly, as shown at a lower stage in FIG. 7, an actual temperature (detected temperature) within the reaction tube 12 is set equal to or substantially equal to the predetermined temperature $T_0$. The cooling jig 3 is placed in the standby region 3a.

Thereafter, when the film forming process for the respective wafers W is completed at time t1, the silicon nitride films are formed on the surfaces of the respective wafers W within the reaction tube 12. As will be described later, the silicon nitride films are formed by supplying a source gas and a reaction gas into the reaction tube 12. Therefore, the silicon nitride films as the deposits 200 are formed not only on the surfaces of the wafers W but also on gas contacting portions within the reaction tube 12, such as the inner wall of the reaction tube 12 and the like. Details of the film forming process performed within the reaction tube 12 will be described later.

Figure 8:
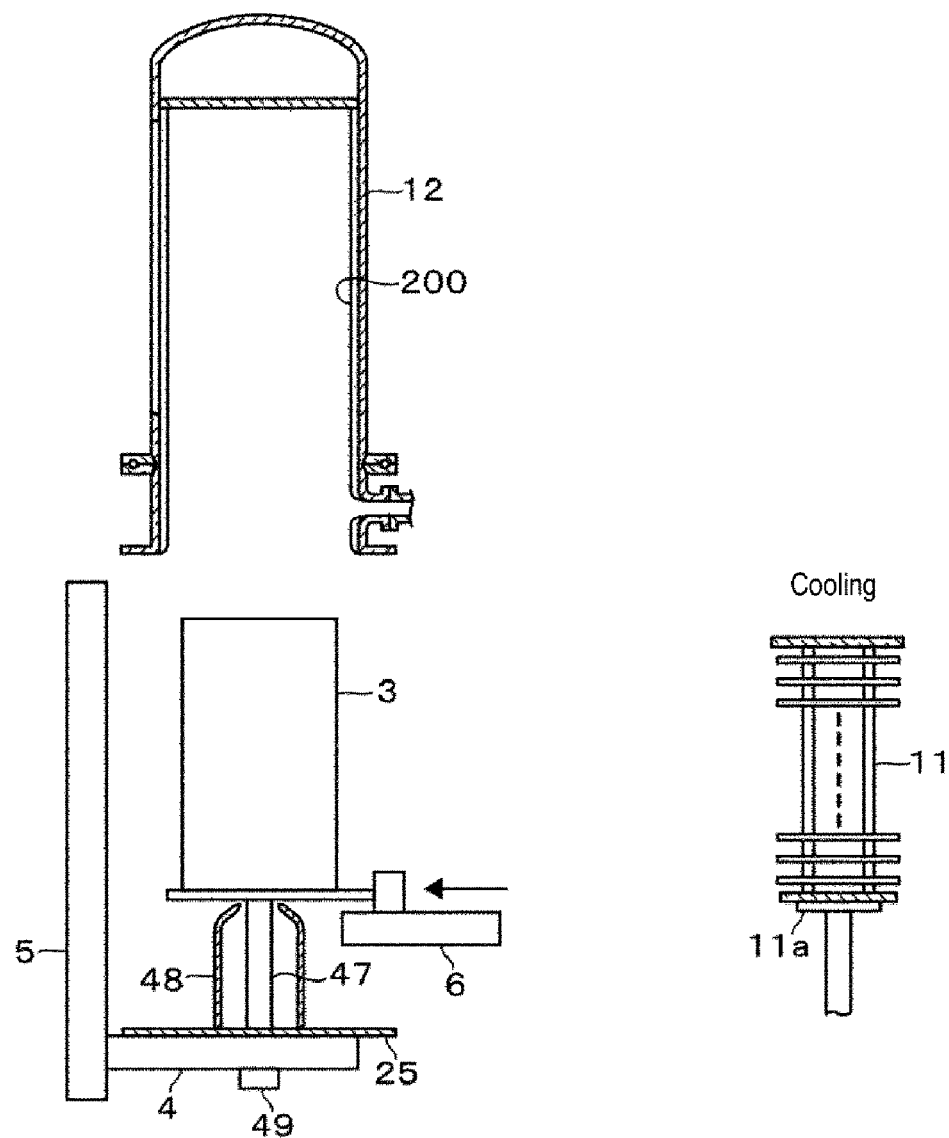
FIG. 8 is a schematic view showing an operation of the vertical heat treatment apparatus.

At time t1 at which the film forming process is completed, the purge gas is supplied into the reaction tube 12 to restore an internal atmosphere of the reaction tube 12 to an air atmosphere. Thereafter, if the wafer boat 11 is moved down, the internal atmosphere of the reaction tube 12 makes contact with a normal temperature atmosphere existing below the reaction tube 12. Thus, the internal atmosphere of the reaction tube 12 is cooled down from the film forming temperature mentioned above. Then, the wafer boat 11 is moved down to a bottom surface of the substrate transfer region 1 (time t2). Thereafter, as shown in FIG. 8, the wafer boat 11 is moved to the standby region 11a by the first transfer mechanism 6, and the cooling jig 3 is transferred to the boat elevator 4 (the wafer boat 11 and the cooling jig 3 are interchanged).

At time t3, the wafer boat 11 transferred to the standby region 11a and the processed wafers W are subjected to cooling. That is to say, since the substrate transfer region 1 is kept at the normal temperature atmosphere, the wafer boat 11 and the processed wafers W exposed in the normal temperature atmosphere are naturally cooled. Alternatively, the wafer boat 11 and the wafers W may be cooled by forcibly spraying a nitrogen gas toward the wafer boat 11 and the processed wafers W. The wafer boat 11 and the processed wafers W are actually cooled after time t1 at which they are taken out from the reaction tube 12. However, for the sake of convenience in description, it is assumed here that cooling is started from time t3 at which the wafer boat 11 and the processed wafers W are placed in the standby region 11a.

Figure 7:
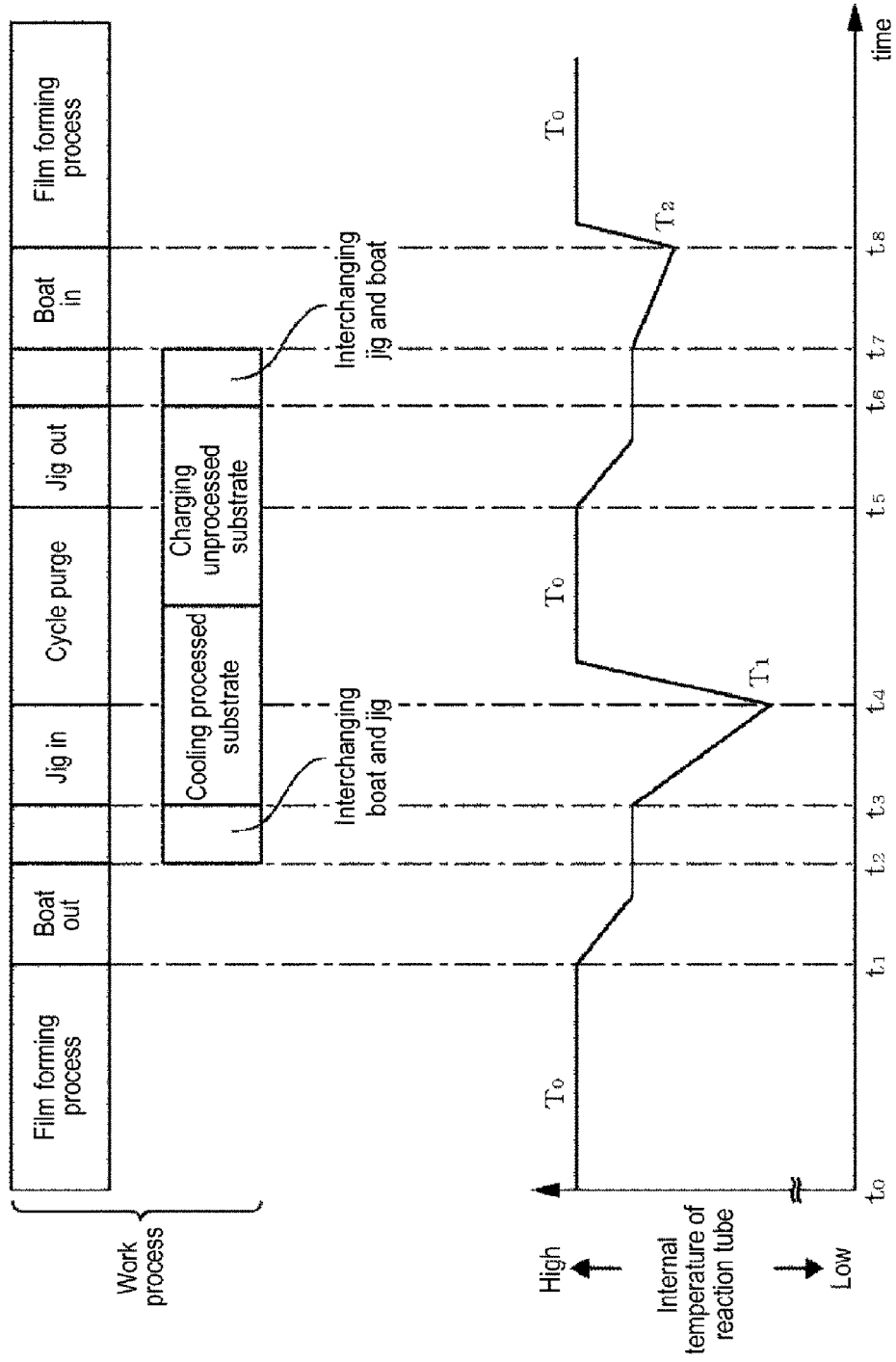
FIG. 7 is a sequence diagram showing one example of a process performed by the vertical heat treatment apparatus.
Figure 9:
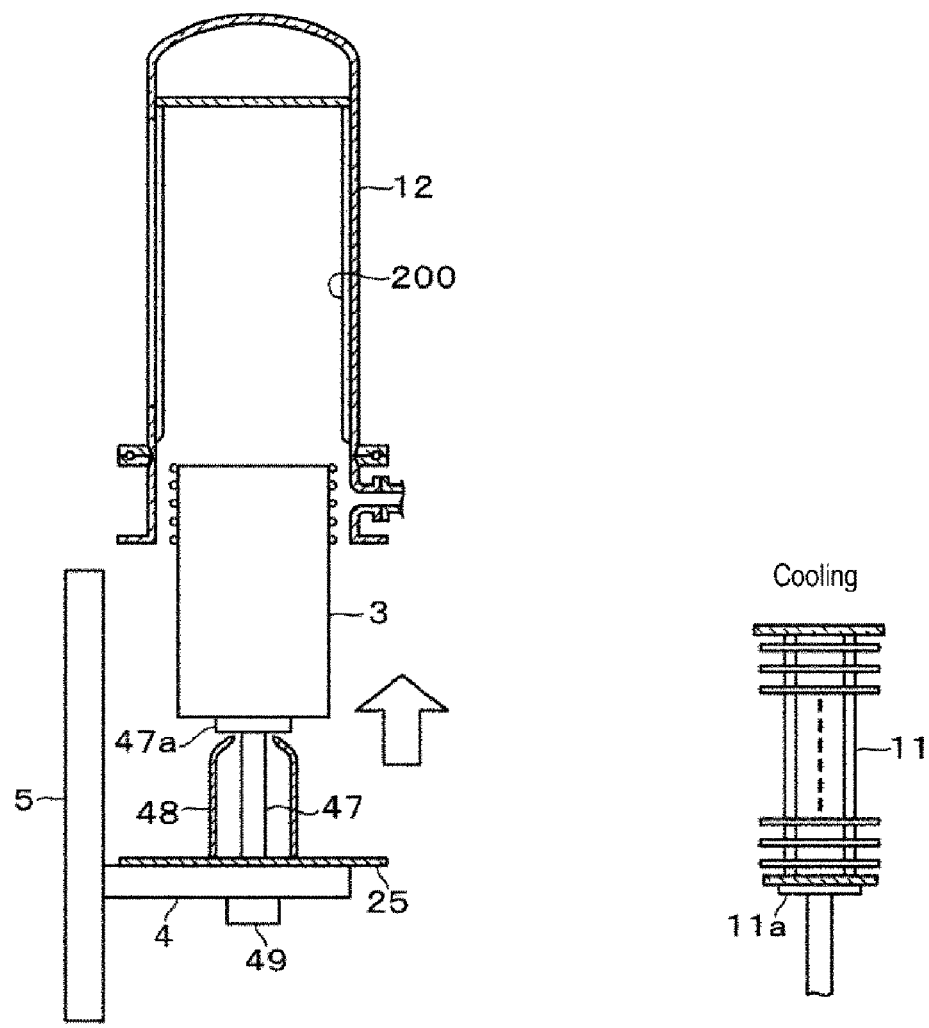
FIG. 9 is a schematic view showing an operation of the vertical heat treatment apparatus.

As shown in FIGS. 7 and 9, the cooling jig 3 begins to be moved up at time t3. At this time, an upward movement speed of the cooling jig 3 is as high as 300 mm/min to 1,800 mm/min. In this example, the upward movement speed of the cooling jig 3 is 600 mm/min.

During the time when the film forming process is performed with respect to the wafers W, the cooling jig 3 is positioned in the substrate transfer region 1 kept at the normal temperature atmosphere. Therefore, a temperature of the cooling jig 3 is lower than the internal temperature of the reaction tube 12. For that reason, if a tip portion of the cold cooling jig 3 is moved up to a position opposing the inner wall surface of the lower end portion of the reaction tube 12, the inner wall surface of the lower end portion is cooled to a temperature $T_1$ (e.g., 350 degrees C.) by the cooling jig 3 as shown in the lower stage in FIG. 7. In the meantime, the cooling jig 3 is heated by the reaction tube 12. As described above, the cooling jig 3 is brought into the reaction tube 12 at a high speed. Accordingly, it can be said that an outer circumferential surface of the cooling jig 3 colder than the inner wall surface of the lower end portion of the reaction tube 12 continues to stay opposite the inner wall surface of the lower end portion of the reaction tube 12 until the cooling jig 3 is completely carried into the reaction tube 12.

As described above, the deposits 200 adhere to the inner wall surface of the reaction tube 12. As mentioned in the section of "BACKGROUND", the deposits 200 are large in internal stress and are larger in thermal expansion rate and thermal contraction rate than quartz of which the reaction tube 12 is made. For that reason, the deposits 200 are peeled off from the inner wall surface of the lower end portion of the reaction tube 12 and tend to stray as particles 10 within the reaction tube 12.

Figure 10:
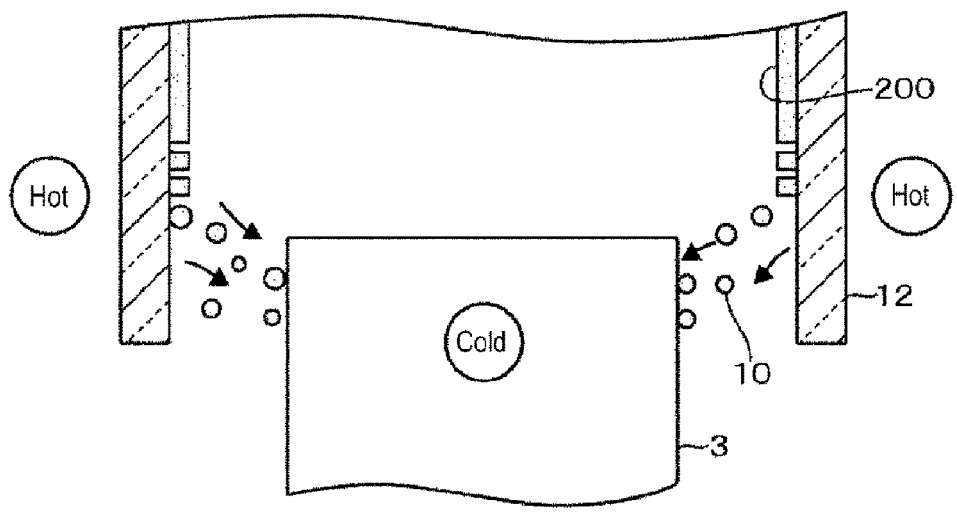
FIG. 10 is a schematic view showing an operation of the vertical heat treatment apparatus.
Figure 11:
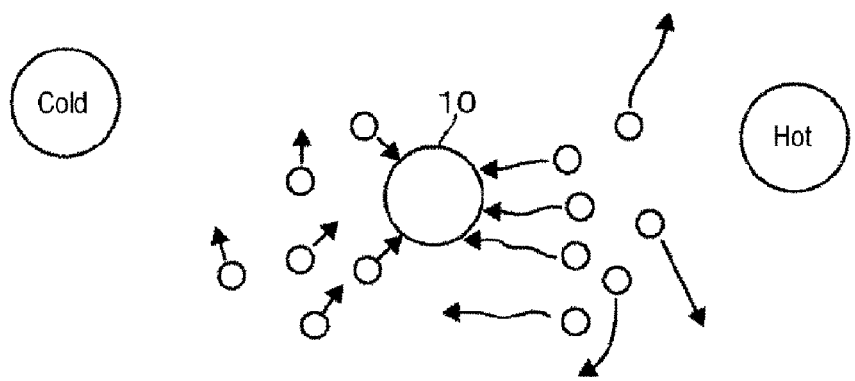
FIG. 11 is a schematic view showing an operation of the vertical heat treatment apparatus.

However, as shown in FIG. 10, the hot reaction tube 12 is positioned at one side of the particles 10 while the cold cooling jig 3 is positioned at the other side of the particles 10 (at the opposite side from the reaction tube 12). Therefore, the particles 10 are attracted toward the cooling jig 3 by thermophoresis. That is to say, as shown in FIG. 11, when a hot member and a cold member are located to be opposite to each other with fine particles such as the particles 10 or the like interposed between the hot member and the cold member, gas molecules existing in atmosphere vigorously move at the side of the hot member while the movement of the gas molecules is not so vigorous at the side of the cold member.

For that reason, the gas molecules collide with the particles 10 during the movement in the atmosphere. At this time, kinetic energy of the particles 10 received from hot gas molecules is higher than a kinetic energy of the particles 10 received from cold gas molecules. Accordingly, under the atmosphere having such a temperature gradient, the particles 10 are attracted toward the cold member (the cooling jig 3) by thermophoresis. Once the particles 10 adhere to the cooling jig 3, it is difficult for the particles 10 to be separated from the cooling jig 3 due to, e.g., an electrostatic force. Thus, even if the deposits 200 adhere to, e.g., outer circumferential surfaces of the respective gas nozzles 51a, 51b and 51c, the deposits 200 adhering to the outer circumferential surfaces of the respective nozzles 51a, 51b and 51c are removed (collected) by the cooling jig 3 just like the deposits 200 adhering to the inner wall surface of the reaction tube 12.

Figure 12:
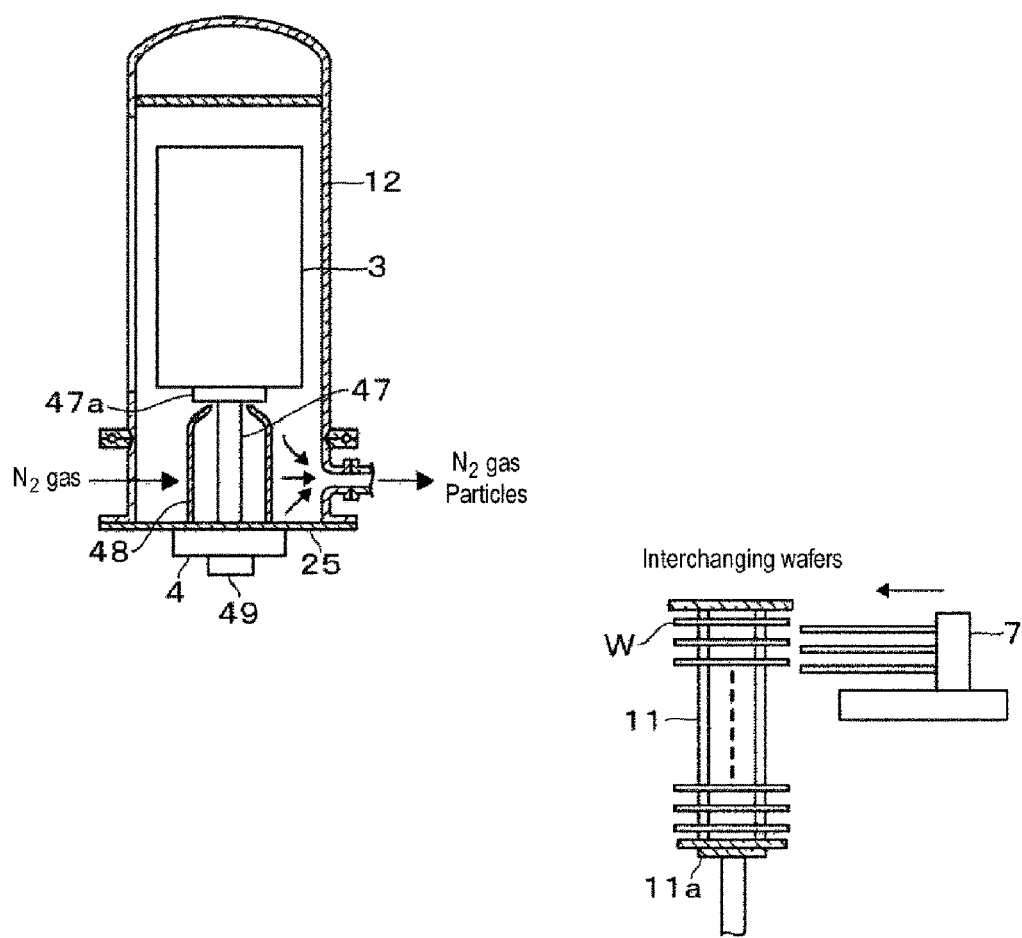
FIG. 12 is a schematic view showing an operation of the vertical heat treatment apparatus.

After the cooling jig 3 is completely carried into the reaction tube 12 (after the interior of the reaction tube 12 has been air-tightly sealed) at time t4, the internal atmosphere of the reaction tube 12 is substituted as shown in FIG. 12. When substituting the atmosphere, the interior of the reaction tube 12 is vacuum-drawn into a vacuum state and, then, the purge gas is intermittently supplied into the reaction tube 12 while keeping the reaction tube 12 in the vacuum state. A so-called cycle purge which repeats the vacuum-drawing and the supply of the purge gas plural times is performed in this way. By substituting the internal atmosphere of the reaction tube 12, the particles 10 which are not strongly adsorbed to the inner wall surface of the reaction tube 12 (which are peeled off from the inner wall surface of the reaction tube 12) or the particles 10 which are not collected by the cooling jig 3 and are straying within the reaction tube 12 are moved toward the exhaust port 21. After time t0, electric power is supplied to the heaters 13 such that the internal temperature of the reaction tube 12 becomes a predetermined temperature $T_0$. Thus, as shown at the lower stage in FIG. 7, the internal temperature of the reaction tube 12 is increased toward, e.g., the film forming temperature.

Thereafter, the substitution of the internal atmosphere of the reaction tube 12 is completed at time t5. Then, the internal atmosphere of the reaction tube 12 is restored to the air atmosphere by the purge gas and the cooling jig 3 is moved down. Since the lower end opening of the reaction tube 12 is opened, the internal temperature of the reaction tube 12 is slightly lowered from the film forming temperature as shown at the lower stage in FIG. 7. Until time t6 at which the cooling jig 3 is completely carried out, the cooling of the wafer boat 11 and the processed wafers W are finished and replacement of the wafers W is performed by the second transfer mechanism 7 as shown in FIG. 12. That is to say, the processed wafers W on the wafer boat 11 are returned to an empty transportation container 41 while unprocessed wafers W are transferred from an additional transportation container 41 to the wafer boat 11. In other words, as shown in FIG. 7, the collection of the particles 10 generated from the inner wall surface of the lower end portion of the reaction tube 12 and the substitution of the internal atmosphere of the reaction tube 12 are finished until time t6 at which the cooling of the wafer boat 11 and the processed wafers W and the replacement of the wafers W are completed.

Figure 13:
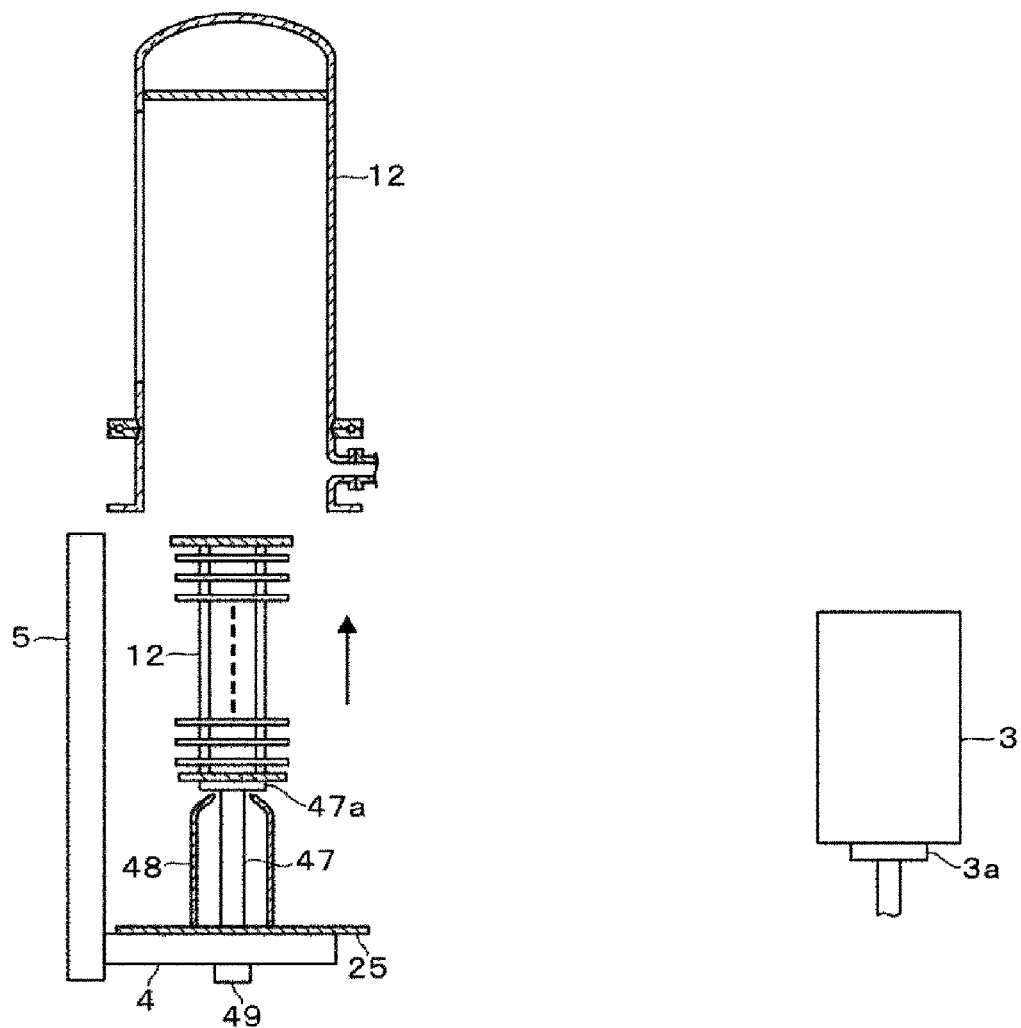
FIG. 13 is a schematic view showing an operation of the vertical heat treatment apparatus.

Subsequently, the cooling jig 3 placed on the boat elevator 4 is interchanged with the wafer boat 11 mounting the unprocessed wafers W. Then, as shown in FIGS. 7 and 13, an upward movement of the wafer boat 11 is started at time t7. An upward movement speed of the wafer boat 11 is lower than the upward movement speed of the cooling jig 3 described above. Specifically, the upward movement speed of the wafer boat 11 is from 200 mm/min to 500 mm/min. In this example, the upward movement speed of the wafer boat 11 is 300 mm/min. As mentioned above, the wafer boat 11 is positioned in the substrate transfer region 1 kept at a normal temperature atmosphere. Thus, the temperature of the wafer boat 11 is lower than the internal temperature of the reaction tube 12. For that reason, as the wafer boat 11 is moved into the reaction tube 12, the inner wall surface of the reaction tube 12 (especially, the inner wall surface of the lower end portion of the reaction tube 12) tends to be cooled.

However, as described above in detail, the upward movement speed of the wafer boat 11 is lower than the upward movement speed of the cooling jig 3. Therefore, during the upward movement of the wafer boat 11, the wafer boat 11 is rapidly heated by the heaters 13. Furthermore, the thermal capacity of the wafer boat 11 is smaller than that of the cooling jig 3. Therefore, if the wafer boat 11 is heated by the heaters 13, the temperature of the wafer boat 11 is rapidly increased. When seen in a plan view, the spaced-apart distance $d_1$ between the wafer boat 11 and the reaction tube 12 is larger than the spaced-apart distance $d_2$ between the cooling jig 3 and the reaction tube 12. For that reason, the reaction tube 12 is hardly affected by the temperature of the wafer boat 11.

As shown at the lower stage in FIG. 7, a temperature $T_2$ of the inner wall surface of the lower end portion of the reaction tube 12 reached by cooling when the wafer boat 11 is carried into the reaction tube 12 is higher than the temperature $T_1$ of the inner wall surface of the lower end portion of the reaction tube 12 reached by cooling when the cooling jig 3 is carried into the reaction tube 12. Specifically, the temperature $T_2$ is, e.g., 400 degrees C. Thus, even if the deposits 200 still adhere to the inner wall surface of the lower end portion of the reaction tube 12, the deposits 200 do not receive a thermal stress which is larger than a thermal stress received when the inner wall surface of the lower end portion of the reaction tube 12 is cooled by the cooling jig 3. Therefore, the deposits 200 are kept adhered to the inner wall surface of the lower end portion of the reaction tube 12. That is to say, as described above, the deposits 200 are greatly different in thermal expansion rate and thermal contraction rate from the inner wall surface of the reaction tube 12. Therefore, if cooling and heating are performed while the deposits 200 are kept adhered to the inner wall surface of the reaction tube 12, the deposits 200 tend to be expanded or contracted due to the thermal stress generated with respect to the inner wall surface of the reaction tube 12. If the thermal stress grows larger than an adhesion force of the deposits 200 to the inner wall surface of the reaction tube 12, the deposits 200 are peeled off (destroyed) into particles 10.

Accordingly, it can be said that, even if a thermal stress smaller than a level at which the adhesion force and the thermal stress compete with each other is applied to the deposits 200, the deposits 200 are not separated or hardly separated from the inner wall surface of the reaction tube 12. In other words, when the wafer boat 11 is carried into the reaction tube 12, the inner wall surface of the lower end portion of the reaction tube 12 is cooled by the wafer boat 11. This may generate particles 10. However, the particles 10 have already been collected in carrying-in process of the cooling jig 3. Thus, adhesion of the particles 10 to the wafers W is prevented. If the wafer boat 11 is air-tightly accommodated within the reaction tube 12 at time t8, the film forming process for the wafers W is started. In FIGS. 8, 9, 12 and 13, the reaction tube 12 and the like are shown in a simplified pattern. Furthermore, the deposits 200 adhering to the portions other than the inner wall surface of the reaction tube 12 are not shown.

Next, a description will be made on one example of a film forming process performed with respect to the respective wafers W within the reaction tube 12. In this example, the silicon nitride films mentioned above are formed by a so-call ALD method in which different kinds (two kinds) of mutually-reacting gases are alternately supplied to the wafers W. Specifically, the wafer boat 11 mounting a plurality of unprocessed wafers W is air-tightly carried into the reaction tube 12. Thereafter, the interior of the reaction tube 12 is vacuum-drawn. Subsequently, the pressure regulating unit 23 (an opening degree of the butterfly valve) is adjusted such that an internal pressure of the reaction tube 12 becomes a processing pressure used when performing the film forming process. The DCS (dichlorosilane) gas is supplied into the reaction tube 12. If the DCS gas makes contact with the respective wafers W, components existing in the DCS gas are adsorbed onto the surfaces of the wafers W, whereby adsorption layers are formed. As described above, the adsorption layers are formed not only on the surfaces of the wafers W but also on the inner wall surface of the reaction tube 12 and so forth.

Subsequently, the supply of the DCS gas is stopped and the interior of the reaction tube 12 is vacuum-drawn. Thereafter, the purge gas is supplied into the reaction tube 12, thereby substituting the internal atmosphere of the reaction tube 12. After the substitution of the internal atmosphere of the reaction tube 12 is performed one or more times, the supply of the purge gas is stopped. The internal pressure of the reaction tube 12 is set at the processing pressure. High-frequency power is supplied to the plasma generating electrodes 61 and 61. Then, an ammonia gas is supplied from the ammonia gas nozzle 51a to the plasma generating region 12c. The ammonia gas is converted to plasma by the high-frequency power supplied to the plasma generating electrodes 61 and 61 and is moved toward the respective wafers W. If the plasma of the ammonia gas makes contact with the surfaces of the respective wafers W, the plasma reacts with the adsorption layers formed on the surfaces of the wafer W or the inner wall surface of the reaction tube 12. As a result, reaction layers composed of silicon nitride are formed.

Thereafter, the supply of the ammonia gas and the supply of the electric power to the plasma generating electrodes 61 and 61 are stopped and the internal atmosphere of the reaction tube 12 is substituted. Then, the internal pressure of the reaction tube 12 is set at the processing pressure. By repeating, plural times, a film forming cycle in which the DCS gas and the plasma of the ammonia gas are alternately supplied into the reaction tube 12, a plurality of reaction layers is laminated one above another. Thus, thin films composed of silicon nitride films are formed.

According to the aforementioned embodiment, when the plurality of wafers W mounted on the wafer boat 11 are collectively subjected to the film forming process of the silicon nitride films within the reaction tube 12, the cooling jig 3 differing from the wafer boat 11 is installed. After the film forming process is completed, the cooling jig 3 instead of the wafer boat 11 is carried into the reaction tube 12. The deposits 200 adhering to the inner wall surface of the reaction tube 12 are peeled off based on a temperature difference between the cooling jig 3 and the reaction tube 12. Furthermore, the deposits 200 peeled off from the inner wall surface of the reaction tube 12 and straying as particles 10 within the reaction tube 12 are caused to adhere to the cooling jig 3 by thermophoresis. Thus, if the wafer boat 11 is carried into the reaction tube 12 in the subsequent film forming process performed after collecting the deposits 200, the deposits 200 existing within the reaction tube 12 are to be peeled off due to the temperature difference between the wafer boat 11 and the reaction tube 12. Since the deposits 200 have already been peeled off by the cooling jig 3, it is possible to suppress adhesion of the particles 10 to the wafers W.

The temperature $T_2$ to which the inner wall surface of the lower end portion of the reaction tube 12 is cooled when the cooling jig 3 is carried into the reaction tube 12, is set lower than the temperature $T_3$ to which the inner wall surface of the lower end portion of the reaction tube 12 is cooled when the wafer boat 11 is carried into the reaction tube 12. Specifically, the cooling jig 3 is configured to have a thermal capacity larger than that of the wafer boat 11. Furthermore, the spaced-apart distance $d_2$ between the cooling jig 3 and the inner wall surface of the reaction tube 12 is set smaller than the spaced-apart distance $d_1$ between the wafer boat 11 and the inner wall surface of the reaction tube 12. Moreover, the upward movement speed of the cooling jig 3 within the reaction tube 12 is set higher than the upward movement speed of the wafer boat 11 within the reaction tube 12.

Accordingly, even if the deposits 200 still remain on the inner wall surface of the reaction tube 12 after the deposits 200 existing in the inner wall surface of the reaction tube 12 are peeled off by the cooling jig 3, the deposits 200 do not receive a thermal stress larger than the thermal stress applied by the cooling jig 3, when the wafer boat 11 is subsequently carried into the reaction tube 12. Since the thermal stress larger than the thermal stress applied to the deposits 200 of the inner wall surface of the reaction tube 12 by the wafer boat 11 is previously applied to the deposits 200, it is possible to suppress contamination of the wafers W otherwise caused by the particles 10.

When the deposits 200 existing in the inner wall surface of the reaction tube 12 are cooled by the cooling jig 3, only the deposits 200 or only the portion of the reaction tube 12 near the deposits 200 is cooled at the inner side of the reaction tube 12 instead of cooling the entirety of the reaction tube 12. The internal temperature of the reaction tube 12 is uniformly set at the temperature $T_0$ during the film forming process. Thus, since the interior of the reaction tube 12 is rapidly heated to the film forming temperature $T_0$ after the deposits 200 are peeled off, it is possible to rapidly start the subsequent process. That is to say, in the present disclosure, only a necessary minimum portion is cooled when peeling the deposits 200 from the inner wall surface of the reaction tube 12. On the other hand, in the technique described in the section of "BACKGROUND", the entirety of the reaction container is cooled at the outer side of the reaction container. For that reason, a certain period of waiting time is required in order to subsequently restore the internal temperature of the reaction container to the film forming temperature. This may lead to a reduction of throughput.

The peeling process of the deposits 200 (the collecting process of the particles 10) using the cooling jig 3 is performed each time when the batch processes for the wafers W are performed. It is therefore possible to stably prevent the particles 10 from being generated throughout the respective batch processes. Furthermore, the peeling process of the deposits 200 using the aforementioned cooling jig 3 is performed while performing the cooling of the processed hot wafers W and the replacement of the processed wafers W and the unprocessed wafers W. In other words, the particles 10 are collected in parallel with an ordinary film forming cycle. Thus, it is possible to prevent the throughput from being reduced as compared with, e.g., a case where, in order to prevent the particles 10 from being generated, a film forming process is first stopped and then resumed after removing the particles 10.

In the example described above, the cycle purge (the vacuum drawing of the interior of the reaction tube 12 and the supply of the purge gas) is performed after the cooling jig 3 is air-tightly accommodated within the reaction tube 12. However, the cycle purge may not be performed. Specifically, the cooling jig 3 may be taken out immediately just after the cooling jig 3 is air-tightly carried into the reaction tube 12. Furthermore, as described above in detail, the particles 10 collected by the cooling jig 3 are generated in a larger amount from the deposits 200 adhering to a lower sidewall of the reaction tube 12 than from the deposits 200 adhering to an upper sidewall of the reaction tube 12. Thus, when carrying the cooling jig 3 into the reaction tube 12, the cooling jig 3 may be moved up to a height level at which an upper end surface of the cooling jig 3 is flush with a position of the lower end portion of the reaction tube 12 or a height level at which an upper end surface of the cooling jig 3 is a little higher than the position of the lower end portion of the reaction tube 12. Then, the cooling jig 3 may be moved down. If the cycle purge is not performed as mentioned above, it is possible to rapidly finish the process for removing the deposits 200.

In some embodiments, "the height level at which the upper end surface of the cooling jig 3 is a little higher than the position of the lower end portion of the reaction tube 12" may be a position higher than the position of the lower end portion of the reaction tube 12 by 30% of the height dimension of the reaction tube 12. That is to say, as described above, the lowermost wafer W is positioned higher in the height direction of the reaction tube 12 than the position of the lower end portion of the reaction tube 12 by 30% of the height dimension of the reaction tube 12. Accordingly, in order to suppress adhesion of the particles 10 to any of the wafers W mounted on the wafer boat 11, it is preferable to previously remove the deposits 200 adhering to the portion of the reaction tube 12 which is positioned lower than the height level flush with the lowermost wafer W.

In the example described above, the relationship between the temperature $T_2$ reached by the inner wall surface of the lower end portion of the reaction tube 12 when the cooling jig 3 is carried into the reaction tube 12 and the temperature $T_3$ reached by the inner wall surface of the lower end portion of the reaction tube 12 when the wafer boat 11 is carried into the reaction tube 12, is set such that $T_2$ becomes lower than $T_3$. The aforementioned effects can be obtained by setting the thermal capacity or an external dimension of the cooling jig 3 or the upward movement speeds of the wafer boat 11 and the cooling jig 3 so as to satisfy the above temperature relationship. However, $T_2$ may be equal to $T_3$. That is to say, it is only necessary that the deposits 200 which would become particles 10 when the wafer boat 11 is carried into the reaction tube 12 can be peeled off by the cooling jig 3. For example, if the amount of the deposits 200 adhering to the inner wall of the reaction tube 12 is not so much, the relationship between $T_2$ and $T_3$ may be set such that $T_2$ becomes higher than $T_3$.

As the cooling jig 3 described above, it may be possible to use, e.g., another wafer boat 11 having the same configuration as the wafer boat 11 for performing the film forming process with respect to the wafers W. In this case, for example, quartz-made dummy wafers larger in thickness than the wafers W may be mounted on the wafer boat 11 for collecting the particles 10, in order to make sure that the thermal capacity of the wafer boat 11 for collecting the particles 10 becomes larger than the thermal capacity of the wafer boat 11 for performing the film forming process.

In the example described above, there is employed the method in which the DCS gas and the plasma of the ammonia gas are alternately supplied. Alternatively, silicon nitride films may be formed by a CVD (Chemical Vapor Deposition) method in which the DCS gas and the ammonia gas are simultaneously supplied into the reaction tube 12. The thin films formed on the wafers W may not be silicon nitride films but may be multi-component-based thin films which are obtained by doping silicon nitride films with boron (B), oxygen (O) or carbon (C), or thin films such as silicon oxide (Si—O) films or the like which are composed of a high-k material as a metal oxide. Taking one example of individual gases used in forming the silicon oxide films, a silicon-containing organic gas is used as a source gas, while an oxygen gas or an ozone ($O_3$) gas is used as a reaction gas which reacts with the source gas. Examples of the high-k material may include a hafnium oxide (Hf—O), an aluminum oxide (Al—O), a zirconium oxide (Zr—O), a strontium oxide (Sr—O) and a titanium oxide (Ti—O). When forming films with the high-k material, a source gas containing a metallic element and an organic substance and an oxidizing gas are used.

While repeating the batch process with respect to the plurality of wafers W, the peeling process of the deposits 200 is performed by the cooling jig 3 each time when the batch process is performed. Alternatively, the peeling process may be performed after the batch process is performed plural times. The cooling jig 3 which has collected the particles 10 may be cleaned just like the wafer boat 11 when cleaning the wafer boat 11 after the aforementioned batch process is performed plural times. Specifically, the cooling jig 3 to which the particles 10 adhere is air-tightly accommodated within the reaction tube 12. Then, a cleaning gas is supplied into the reaction tube 12 while heating the interior of the reaction tube 12. By doing so, the particles 10 are etched and are discharged through the exhaust port 21.

Next, another example of the cooling jig 3 will be described. The cooling jig 3 may not be the hollow body employed in the aforementioned embodiment but may be a tubular body with upper and lower surfaces thereof opened or a tubular body with one of upper and lower surfaces thereof opened.

Figure 14:
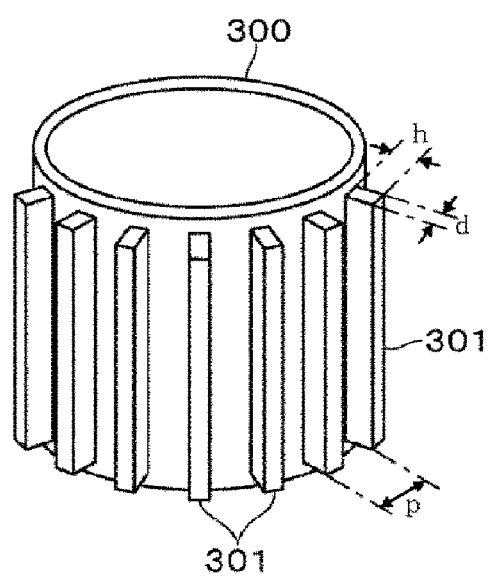
FIG. 14 is a perspective view showing another example of a cooling jig.

Furthermore, the cooling jig 3 may have a configuration in which a plurality of protrusions is formed on the outer circumferential surface of the cooling jig 3 opposing the inner circumferential surface of the reaction tube 12. FIG. 14 shows one example of the cooling jig 3 having such a configuration. The cooling jig 3 of this example includes a cylindrical body 300 and a plurality of rectangular protrusions 301 formed on an outer circumferential surface of the cylindrical body 300 at a specified interval in the circumferential direction. Each of the protrusions 301 extends in the axial direction (up-down direction) of the cylindrical body 300 and has a substantially quadrilateral cross section.

A distance from the surface of each of the protrusions 301 opposing the inner circumferential surface of the reaction tube 12 to the center axis of the cylindrical body 300 is larger than the radius of the wafer boat 11. Therefore, when the cooling jig 3 is carried into the reaction tube 12, the distance between the protrusions 301 and the reaction tube 12 is smaller than the distance between the wafer boat 11 and the reaction tube 12. Examples of dimensions of the respective portions of the cooling jig 3 shown in FIG. 14 are as follows. A height of the cylindrical body 300 is from 200 mm to 1,000 mm. A height h of the protrusion 301 is from 10 mm to 100 mm. A width d of the protrusion 301 is from 2 mm to 20 mm. An arrangement pitch of the protrusion 301 (a gap between width-direction centers of the protrusions 301 adjoining each other) P is from 5 mm to 20 mm. In FIG. 14, for the sake of convenience in illustration, the protrusions 301 are shown to have dimensions which do not match with the aforementioned dimensions.

Figure 15:
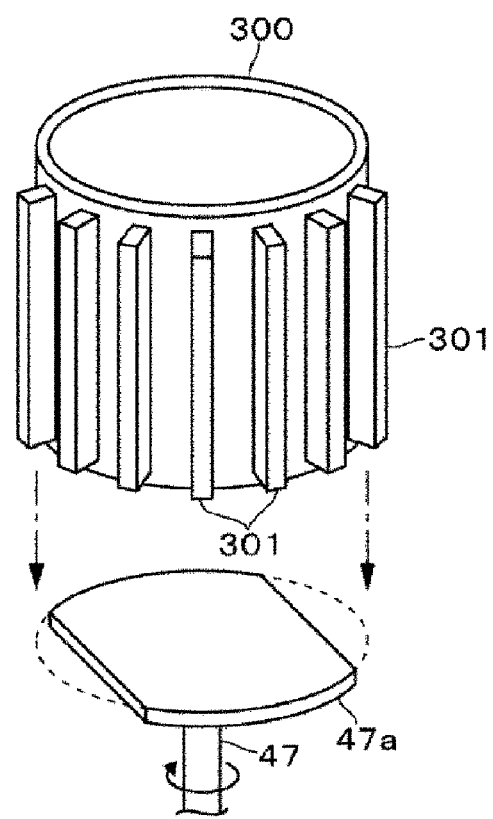
FIG. 15 is a perspective view showing an example of a rotary table when the cooling jig has a cylindrical shape.

For example, as shown in FIG. 15, a rotary table 47a for holding the cooling jig 3 provided with the cylindrical body 300 is formed into such a shape that the mutually-opposing peripheral edge portions of a disc having the same outer diameter as the cylindrical body 300 are cut away. The dot line indicates a contour of the disc which is not cut away. Cutaway portions of the disc become entry regions of the arm 35 for transferring the cooling jig 3.

Figure 16:
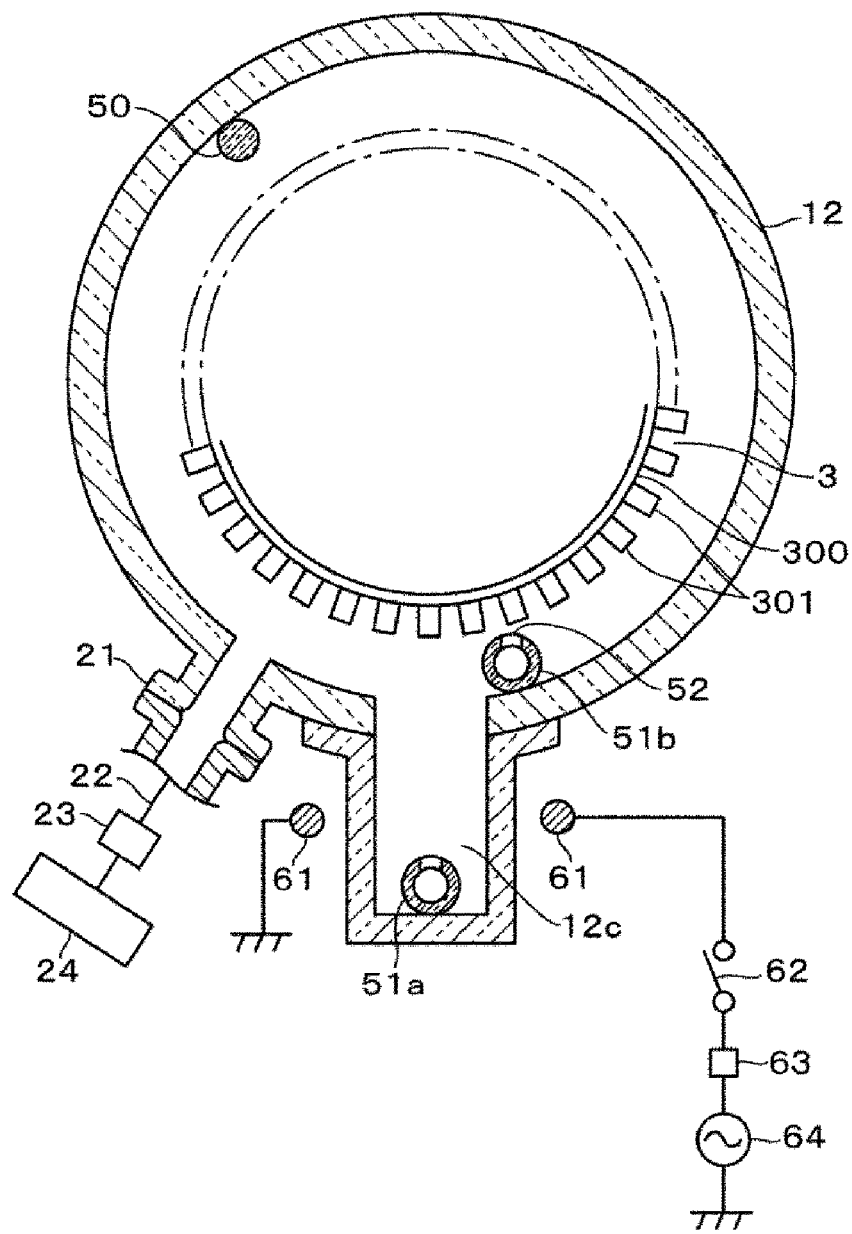
FIG. 16 is horizontal sectional view showing when the cooling jig shown in FIG. 14 is disposed within a reaction tube.
Figure 17:
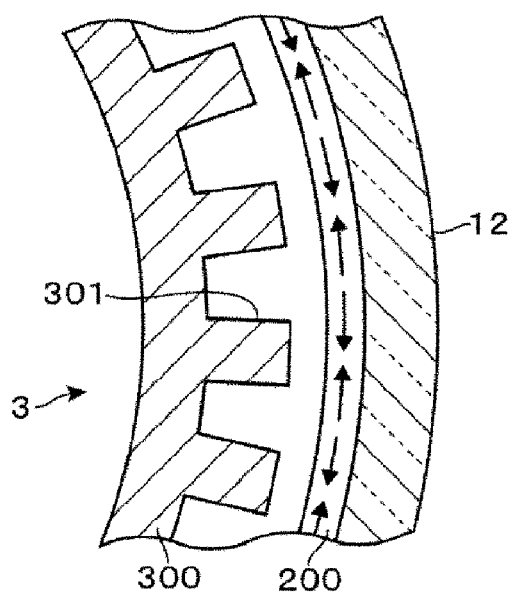
FIG. 17 is an explanatory view showing an appearance when the cooling jig shown in FIG. 14 is disposed within the reaction tube.

FIG. 16 is a horizontal sectional view showing a state in which the cooling jig 3 shown in FIG. 14 is carried into the reaction tube 12. In FIG. 16, the distance between the cooling jig 3 and the reaction tube 12 and the dimensions of the protrusions 301 are depicted merely for the sake of convenience and are not actual dimensions. FIG. 17 is a partially enlarged view showing a state in which the cooling jig 3 is carried into the reaction tube 12. Since the cooling jig 3 is provided with the protrusions 301, the distance between the deposits 200 adhering to the reaction tube 12 and the cooling jig 3 differs depending on circumferential positions when the deposits 200 are seen in a cross-sectional view. Thus, temperature variations occur. That is to say, a temperature of portions of the deposits 200 opposing the protrusions 301 is lower than a temperature of portions of the deposits 200 not opposing the protrusions 301. For that reason, as indicated by arrows, stresses acting from high temperature portions toward low temperature portions are generated. Thus, the peeling of the deposit is further promoted.

Figure 18:
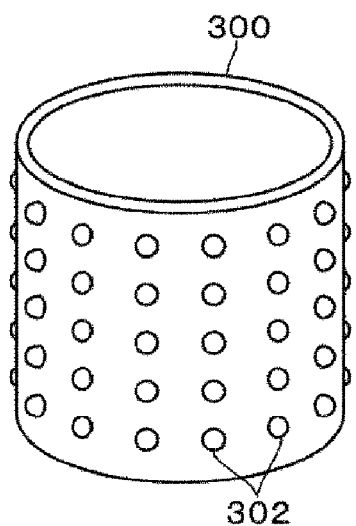
FIG. 18 is a perspective view showing still another example of the cooling jig.
Figure 19:
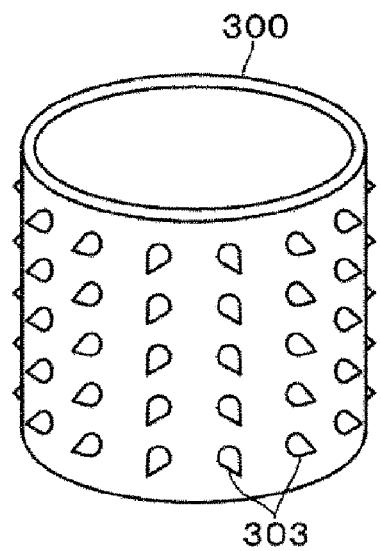
FIG. 19 is a perspective view showing still another example of the cooling jig.

As mentioned above, the use of the cooling jig 3 provided with the protrusions 301 is effective. Examples of similar configurations include cooling jigs 3 shown in FIGS. 18 and 19. The cooling jig 3 shown in FIG. 18 includes a cylindrical body 300 and plural rows of vertically-arranged protrusions 302 each having a dome shape, e.g., a hemispherical shape. The rows of protrusions 302 are arranged in a circumferential direction of the cylindrical body 300. The cooling jig 3 shown in FIG. 19 is configured by replacing the dome-shaped protrusions 302 shown in FIG. 18 with conical protrusions 303. While not shown in the drawings, it may be possible to use a cooling jig 3 in which the dome-shaped protrusions 302 shown in FIG. 18 are replaced with rectangular block-shaped protrusions.

Dimensions of the respective protrusions 302 and 303 shown in FIGS. 18 and 19 may be as follows. For example, a height of the respective protrusions 302 and 303 is from 10 mm to 100 mm. A diameter of the respective protrusions 302 and 303 at the side of the cylindrical body 300 (at a root side of the protrusions) is from 2 mm to 20 mm. An arrangement pitch of the respective protrusions 302 and 303 is from 5 mm to 20 mm. In case where the protrusions have a rectangular block shape, a height and an arrangement pitch are the same as mentioned just above and a width is, e.g., from 2 mm to 20 mm.

The types of the protrusions of the cooling jig 3 are not limited to the aforementioned examples. As an alternative example, it may be possible to use, e.g., a structure in which ring-shaped protrusions extending in the circumferential direction of the cylindrical body 300 are formed at a specified interval in the vertical direction. In addition, irregularities may be formed by forming a plurality of concave portions on the outer circumferential surface of the cylindrical body 300. Even in this case, the outer circumferential surface of the cylindrical body 300 corresponds to protrusions from the viewpoint of the concave portions. This means that the protrusions are formed on the cylindrical body 300.

According to the present disclosure, when a plurality of substrates is collectively subjected to the film forming process within the vertical reaction tube, the cooling jig for peeling particles from the inner wall of the reaction tube is installed in addition to the substrate holder for supporting the substrates. After the film forming process is finished, the substrate holder is interchanged with the cooling jig positioned in the substrate transfer region while keeping the internal temperature of the reaction tube at a predetermined temperature. Thus, the inner wall surface of the reaction tube is cooled to a low temperature by the cooling jig. Along with the cooling, the particles peeled off from the inner wall surface of the reaction tube are adsorbed to the cooling jig by thermophoresis. Thus, when the film forming process is subsequently performed with respect to unprocessed substrates, it is possible to suppress adhesion of particles to the substrates.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An operating method of a vertical heat treatment apparatus which performs a film forming process by keeping the interior of a vertical reaction tube surrounded by a heating mechanism at a vacuum atmosphere and by supplying film forming gases to substrates accommodated within the reaction tube, comprising:
    performing a film forming process with respect to the substrates by carrying a substrate holder holding a plurality of substrates in a shelf form into the reaction tube;
    carrying out the substrate holder from the reaction tube; and
    carrying a cooling jig into the reaction tube to cool an inner wall of the reaction tube so as to peel a thin film adhering to the inner wall of the reaction tube by a thermal stress and so as to collect the thin film in the cooling jig by thermophoresis, wherein processed substrates held in the substrate holder are interchanged with unprocessed substrates while the cooling jig is positioned within the reaction tube.

2. The method of claim 1, wherein a purge gas is supplied into the reaction tube while evacuating the interior of the reaction tube, when the cooling jig is positioned within the reaction tube.

3. The method of claim 1, wherein the cooling jig is a tubular body.

4. The method of claim 1, wherein $T_2$ is smaller than $T_1$ where $T_1$ is a temperature of an inner wall of a vertical lower end portion of the reaction tube at a time point when the substrate holder holding the substrates is completely carried into the reaction tube and $T_2$ is a temperature of the inner wall of the vertical lower end portion of the reaction tube at a time point when the cooling jig is completely carried into the reaction tube.

5. The method of claim 4, wherein a distance between the cooling jig and an inner circumferential wall of the reaction tube is smaller than a distance between the substrate holder and the inner circumferential wall of the reaction tube, in a height region corresponding to 30% or more of a height-direction dimension of the reaction tube.

6. The method of claim 4, wherein the cooling jig is larger in thermal capacity than the substrate holder.

7. The method of claim 4, wherein a speed at which the cooling jig is carried into the reaction tube is higher than a speed at which the substrate holder is carried into the reaction tube.

8. The method of claim 1, wherein the cooling jig includes a plurality of protrusions formed on an outer circumferential surface of the cooling jig opposing an inner circumferential surface of the reaction tube.

9. The method of claim 8, wherein the cooling jig includes a cylindrical portion and the protrusions are formed on the cylindrical portion at a specified interval along a circumferential direction of the cylindrical portion.

* * * * *